(12) United States Patent
Ni

(10) Patent No.: US 11,594,583 B2
(45) Date of Patent: Feb. 28, 2023

(54) OLED DISPLAY PANEL

(71) Applicant: Wuhan China Star Optoelectronics Semiconductor Display Technology Co., Ltd., Wuhan (CN)

(72) Inventor: Jing Ni, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 177 days.

(21) Appl. No.: 16/631,456

(22) PCT Filed: Sep. 17, 2019

(86) PCT No.: PCT/CN2019/106146
§ 371 (c)(1),
(2) Date: Jan. 16, 2020

(87) PCT Pub. No.: WO2020/248416
PCT Pub. Date: Dec. 17, 2020

(65) Prior Publication Data
US 2021/0359039 A1 Nov. 18, 2021

(30) Foreign Application Priority Data
Jun. 11, 2019 (CN) .......................... 201910500274.X

(51) Int. Cl.
*H01L 51/52* (2006.01)
*H01L 27/32* (2006.01)

(52) U.S. Cl.
CPC ...... *H01L 27/3244* (2013.01); *H01L 27/3276* (2013.01); *H01L 51/5209* (2013.01); *H01L 51/5215* (2013.01); *H01L 51/5218* (2013.01); *H01L 51/5246* (2013.01); *H01L 27/3246* (2013.01); *H01L 51/5256* (2013.01)

(58) Field of Classification Search
CPC ............. H01L 51/5215; H01L 51/5246; H01L 51/525; H01L 51/5231; H01L 27/3246; H01L 27/3276–3279; H01L 51/5218; H01L 51/5209; H01L 51/5225
See application file for complete search history.

(56) References Cited

U.S. PATENT DOCUMENTS

| 2011/0140114 A1 | 6/2011 | Ko et al. |
| 2016/0013451 A1 | 1/2016 | Cheng et al. |

(Continued)

FOREIGN PATENT DOCUMENTS

| CN | 108022948 | 5/2018 |
| CN | 108074958 | 5/2018 |

(Continued)

*Primary Examiner* — Yu Chen

(57) ABSTRACT

An organic light-emitting diode (OLED) display panel is provided, including a base substrate and an anode. The base substrate includes a display region and a non-display region. A dam region having a blocking wall is in the non-display region. The anode is positioned on the base substrate and extended into the dam region from the display region. The blocking wall is on a surface of the anode. A first portion of the anode includes a first conductive layer, a metal thin film layer, and a second conductive layer stacked one above another. A second portion of the anode includes a portion of the metal thin film layer, and the second portion is positioned at least in the dam region.

18 Claims, 2 Drawing Sheets

(56) References Cited

U.S. PATENT DOCUMENTS

| | | | |
|---|---|---|---|
| 2016/0149156 A1* | 5/2016 | Kim | .................... H01L 51/5228 |
| | | | 257/40 |
| 2017/0133620 A1* | 5/2017 | Lee | .................... H01L 27/3276 |
| 2017/0141176 A1* | 5/2017 | Im | ....................... H01L 51/5228 |
| 2018/0136767 A1 | 5/2018 | Hamada et al. | |
| 2018/0145118 A1 | 5/2018 | Kim et al. | |
| 2018/0190944 A1 | 7/2018 | Lee et al. | |
| 2019/0123121 A1* | 4/2019 | Liu | .................... H01L 27/3246 |
| 2019/0393443 A1 | 12/2019 | Chen | |

FOREIGN PATENT DOCUMENTS

| | | | |
|---|---|---|---|
| CN | 108269943 | | 7/2018 |
| CN | 108550617 | | 9/2018 |
| CN | 109659444 | | 4/2019 |
| CN | 110137381 | | 8/2019 |
| KR | 10-1108160 | | 1/2012 |
| KR | 20210154414 A | * | 12/2021 |

* cited by examiner

OLED DISPLAY PANEL

RELATED APPLICATIONS

This application is a National Phase of PCT Patent Application No. PCT/CN2019/106146 having International filing date of Sep. 17, 2019, which claims the benefit of priority of Chinese Patent Application No. 201910500274.X filed on Jun. 11, 2019. The contents of the above applications are all incorporated by reference as if fully set forth herein in their entirety.

FIELD AND BACKGROUND OF THE INVENTION

The present invention relates to a field of display devices and in particular, to an organic light-emitting diode (OLED) display panel.

Organic light-emitting diodes (OLEDs) have many advantages for development in solid-state lighting and flat panel displays. Therefore, more and more mobile phone manufacturers have chosen OLED panels as displays. Narrow border OLED panels have become popular for mobile phone screens in recent years.

OLED devices need to be stored or lit for a period of time in a high temperature and high humidity environment (e.g., 85° C./85% humidity) for reliability testing. An anode in a conventional structure is a first conductive layer (bottom ITO), a metal thin film layer (Ag), and a second conductive layer (top ITO) which are stacked one above another. After an OLED display panel with this configuration is placed under high temperature and high humidity conditions for a period of time, it is found that the anode is tend to peel at layer interfaces in a dam region at an edge of the display panel, especially in a sloped region. That is to say, peeling occurs at interfaces between adjacent two of the ITO/Ag/ITO layers.

Therefore, conventional techniques have drawbacks and are in urgent need of improvement.

SUMMARY OF THE INVENTION

The present invention provides an organic light-emitting diode (OLED) display panel which prevents peeling at interfaces between layers of an anode at an edge of the display panel.

Accordingly, the present provides solutions as follows.

The present invention provides an organic light-emitting diode (OLED) display panel, comprising:

a base substrate, the base substrate comprising a display region and a non-display region surrounding the display region, wherein a dam region is disposed in the non-display region, and at least one blocking wall is disposed in the dam region; and an anode disposed on the base substrate and extended into the dam region from the display region, the at least one blocking wall disposed on a surface of the anode;

wherein the anode comprises a first portion and a second portion, the first portion comprises a first conductive layer, a metal thin film layer, and a second conductive layer stacked one above another, the second portion is the metal thin film layer, and the second portion of the anode is disposed at least in the dam region.

In the OLED display panel, wherein the first portion of the anode is disposed at least in the display region.

In the OLED display panel, wherein a length of the first portion of the anode in the non-display region is less than or equal to a distance between the display region and the dam region.

In the OLED display panel, the first conductive layer of the anode and the second conductive layer of the anode have different lengths in the non-display region.

In the OLED display panel, the first conductive layer of the anode and the second conductive layer of the anode have a same length in the non-display region.

In the OLED display panel, the second portion of the anode is disposed in the dam region, and the first portion of the anode is extended from the display region to the non-display region until contacting the dam region.

In the OLED display panel, the first portion of the anode is disposed in the display region, and the second portion of the anode is disposed in the non-display region.

In the OLED display panel, the first conductive layer and the second conductive layer are made of at least one of indium tin oxide, indium zinc oxide, zinc oxide, indium oxide, indium gallium oxide, and zinc aluminum oxide, and the metal thin film layer is made of at least one of aluminum, platinum, palladium, silver, magnesium, gold, nickel, neodymium, iridium, chromium, lithium, calcium, molybdenum, titanium, tungsten, and copper.

In the OLED display panel, further comprising:

a light-emitting layer disposed on the anode and arranged in an array pattern corresponding to a pixel region; and a cathode disposed on the light-emitting layer.

In the OLED display panel, the cathode is extended from the display region toward an edge of the dam region at one side thereof closer to the display region.

Accordingly, the present further provides an organic light-emitting diode (OLED) display panel, comprising:

a base substrate, the base substrate comprising a display region and a non-display region surrounding the display region, wherein a dam region is disposed in the non-display region, and at least one blocking wall is disposed in the dam region; and an anode disposed on the base substrate and extended into the dam region from the display region, the at least one blocking wall disposed on a surface of the anode;

wherein the anode comprises a first portion and a second portion, the first portion is electrically connected to the second portion, the first portion comprises a first conductive layer, a metal thin film layer, and a second conductive layer stacked one above another, the second portion is the metal thin film layer, and the second portion of the anode is disposed at least in the dam region.

In the OLED display panel, the first portion of the anode is disposed at least in the display region.

In the OLED display panel, a length of the first portion of the anode in the non-display region is less than or equal to a distance between the display region and the dam region.

In the OLED display panel, the first conductive layer of the anode and the second conductive layer of the anode have different lengths in the non-display region.

In the OLED display panel, the first conductive layer of the anode and the second conductive layer of the anode have a same length in the non-display region.

In the OLED display panel, the second portion of the anode is disposed in the dam region, and the first portion of the anode is extended from the display region to the non-display region until contacting the dam region.

In the OLED display panel, the first portion of the anode is disposed in the display region, and the second portion of the anode is disposed in the non-display region.

In the OLED display panel, the first conductive layer and the second conductive layer are made of at least one of indium tin oxide, indium zinc oxide, zinc oxide, indium oxide, indium gallium oxide, and zinc aluminum oxide, and the metal thin film layer is made of at least one of aluminum, platinum, palladium, silver, magnesium, gold, nickel, neodymium, iridium, chromium, lithium, calcium, molybdenum, titanium, tungsten, and copper.

In the OLED display panel, the OLED display panel further comprising:

a light-emitting layer disposed on the anode and arranged in an array pattern corresponding to a pixel region; and a cathode disposed on the light-emitting layer.

In the OLED display panel, the cathode is extended from the display region toward an edge of the dam region at one side thereof closer to the display region.

Advantages of the Present Invention

Compared with conventional OLED display panels, the OLED display panel provided by the present application is designed such that the anode has different structures in the display region and the peripheral non-display region. That is, a portion of the anode in the display region has a conventional layer structure, i.e. an ITO/Ag/ITO composite layer, but a portion of the anode outside the display region, especially in the dam region, only has an Ag layer without having upper and lower ITO layers. That is, the first conductive layer (a bottom ITO layer) and the second conductive layer (a top ITO layer) are simultaneously inwardly retracted by a certain distance compared to the conventional structure. Such configuration effective prevents the anode from peeling at interfaces between the ITO and Ag layers in the dam region.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DESCRIPTION OF SPECIFIC EMBODIMENTS OF THE INVENTION

Figure 1:
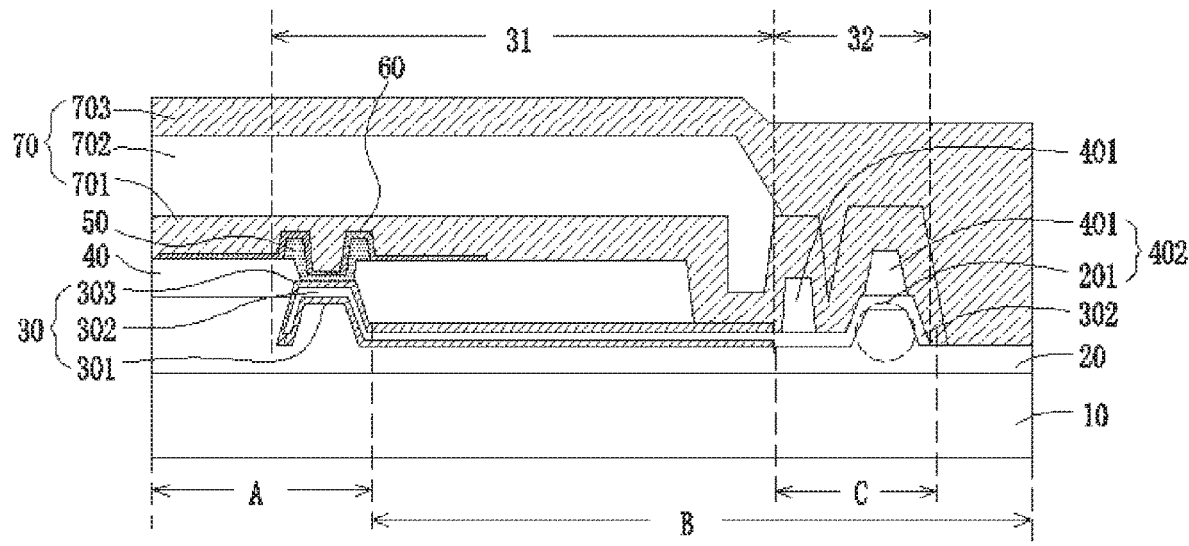
FIG. 1 is a schematic structural view illustrating an organic light-emitting diode (OLED) display panel according to one embodiment of the present invention.

The following description is provided to illustrate some embodiments of the present invention. Directional terms such as "upper", "lower", "front", "rear", "left", "right", "inside", "outside", "lateral side" are merely descriptive with reference to the accompanying drawings. Therefore, the directional terms are only used for the purpose of illustration and understanding of the invention and not intended to be limiting. In the drawings, structurally similar elements are denoted by the same reference numerals.

The present application is directed to solving a problem of a conventional OLED display panel. The problem is that, an anode is tend to have interface peeling in a dam region at an edge of a display panel, which affects quality of the display panel.

Please refer to FIG. 1, which is a schematic structural view of an organic light-emitting diode (OLED) display panel.

The OLED display panel comprises:

a base substrate 10, the base substrate 10 comprising a display region A and a non-display region B surrounding the display region A, wherein a dam region C is disposed in the non-display region B, the base substrate 10 comprises a plurality of inorganic film layers and thin-film transistors constituted by a composite film layer and arranged in an array;

a planarization layer 20 disposed on the base substrate 10; and an anode 30 disposed on the planarization layer 20 and arranged in an array, wherein the anode 30 is extended at least into the dam region C from the display region A, a pixel defining layer 40 is disposed on the anode 30 and defines a pixel region, the pixel defining layer 40 forms at least one first blocking wall 401 in the dam region C, and the at least one blocking wall 401 is disposed on a surface of the anode 30.

The anode 30 comprises a first portion 31 and a second portion 32, and the first portion 31 is electrically connected to the second portion 32. The first portion 31 comprises a first conductive layer 301, a metal thin film layer 302, and a second conductive layer 303 stacked one above another. The second portion 32 is the metal thin film layer 302, and the second portion 32 of the anode 30 is disposed at least in the dam region C. The first portion 31 of the anode 30 is disposed at least in the display region A.

The first conductive layer 301 and the second conductive layer 303 are made of at least one of indium tin oxide (ITO), indium zinc oxide (IZO), zinc oxide (ZnO), indium oxide (In2O3), indium gallium oxide (IGO), and zinc aluminum oxide (AlZO). The metal thin film layer is made of at least one of aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu).

In the present embodiment, it is preferable that at least two blocking walls 401 are arranged spaced apart from each other in a direction from the display region A to the dam region C.

In the present embodiment, the first blocking walls 401 surrounds the display region A. Any adjacent two of the first blocking walls 401 can be of the same or different heights.

According to one embodiment of the present invention, a spacer pad (not illustrated) is disposed on the pixel defining layer 40. A material of the first blocking wall 401 includes, but not limited to, at least one material of the pixel defining layer 40 and the spacer pad.

As shown in FIG. 1, the second portion 32 of the anode 30 is disposed in the dam region C. The first portion 31 of the anode 30 is extended from the display region A to the non-display region B until contacting the dam region C. The anode 30 only has the metal thin film layer 302 in the dam region C, but in other region, the anode 30 has the first conductive layer 301, the metal thin film layer 302, and the second conductive layer 303 stacked one above the other.

Such configuration effective avoids a peeling problem which occurs at layer interfaces of the anode 30 in the dam region C.

In the present embodiment, the planarization layer 20 forms a protrusion 201 in the dam region C. The second portion 32 of the anode 30 passes through the protrusion 201 and extends to a boundary of the dam region C. At least one of the first blocking walls 401 is superposed on the protrusion 201 to form a second blocking wall 402. As shown in the drawings, a height of the second blocking wall 402 is greater than a height of the first blocking wall 401, so that a topography/terrain in the dam region C is increasingly higher from a side closer to the display region A to a side far from the display region A, thereby providing a better blocking function. The second blocking wall 402 is positioned on one side of the dam region C away from the display region A, and the protrusion 201 is distributed in the same manner as the first blocking wall 401, i.e. surrounding a periphery of the display area A.

The protrusion 201 forms a "sloped area" in the dam region C. As a result, if the anode 30 here still has the first conductive layer 301, the metal thin film layer 302, and the second conductive layer 303 stacked one above another, the anode 30 is tend to cause a peeling problem between layers in the dam region C, especially in the "sloped area", thus affecting product performance of the display panel. However, the anode of the present invention only reserves the metal thin film layer 302 in the dam region C. Such configuration avoids the peeling problem of the anode 30.

According to one embodiment of the present invention, at least two protrusions 201 spaced apart from each other surround the display region A. In the dam region C, the first blocking wall 401 is disposed on one side closer to the display region A, a third blocking wall (not illustrated) formed by superposing the patterned spacer pad on the second blocking wall 402 is disposed on one side away from the display region A, and the second blocking wall 402 is disposed between the first blocking wall 401 and the third blocking wall.

The OLED display panel further comprises:

an electron injection layer (not illustrated), an electron transport layer (not illustrated), a light-emitting layer 50, a hole transport layer (not illustrated), and a hole injection layer (not illustrated) which are sequentially stacked on the pixel region;

a cathode 60 disposed on the light-emitting layer 50;

a thin film encapsulation layer 70 disposed on the cathode 60, the thin film encapsulation layer 70 at least including a first inorganic layer 701, an organic layer 702, and a second inorganic layer 703. The cathode 60 is extended from the display region A toward an edge of the dam region C on one side thereof closer to the display area A.

In the present embodiment, the organic layer 702 of the thin film encapsulation layer 70 is extended from the display region A to the edge of the dam region C on one side thereof closer to the display region A. In the drawings, the organic layer 702 is blocked by the first blocking wall 401 when extended to the first blocking wall 401. The first inorganic layer 701 and the second inorganic layer 703 are extended from the display region A and extended at least to an edge of the dam region C on one side thereof away from the display region A. The first inorganic layer 701 and the second inorganic layer 703 are stacked on each other in a contact manner in the dam region C.

In a manufacturing process of the display panel, the planarization layer 20 and the pixel defining layer 40 are of the same or different organic materials. In the anode 30, the first conductive layer 301, the metal thin film layer 302, and the second conductive layer 303 are obtained by pulsed laser deposition (PLD) or magnetron sputtering deposition (sputter) and then are subjected to a series of processes such as organic coating, exposure, development, and etching to obtain etched forms. The light-emitting layer 50 and the cathode 60 are all deposited by vapor deposition, and a thickness of a film layer of the cathode 60 is within 30 nm.

The first inorganic layer 701 and the second inorganic layer 703 are made of, but not limited to, at least one of inorganic materials such as Al2O3, TiO2, SiNX, SiCNX, SiOX, and ZrO2, for enhancing water and oxygen barrier properties. The first inorganic layer 701 and the second inorganic layer 703 both have a thickness ranges from 0.01 um to 1 um. The organic layer 702 is made of, but not limited to, at least one of hexamethyldisiloxane (HMDSO), acrylate, polyacrylate, polycarbonate, polystyrene, and the like.

Figure 2:
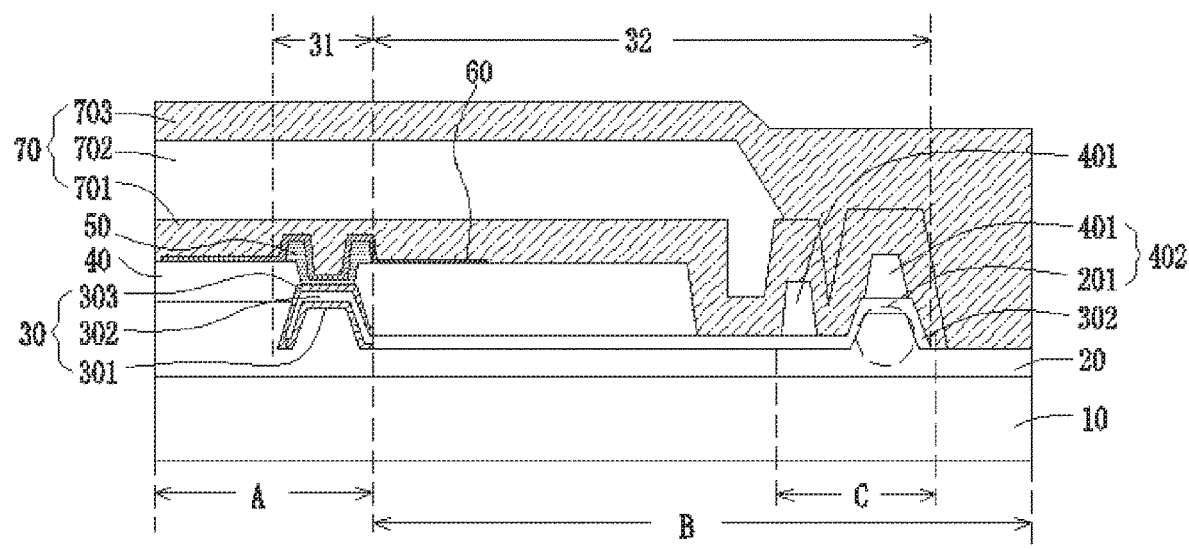
FIG. 2 is a schematic structural view illustrating the OLED display panel according to another embodiment of the present invention.

FIG. 2 is a schematic structural view illustrating the OLED display panel according to another embodiment of the present invention. The display panel shown in FIG. 2 is different from the display panel shown in FIG. 1 in that, the first portion 31 of the anode 30 is disposed in the display region A, and the second portion 32 of the anode 30 is disposed in the non-display region B. In detail, the anode 30 in the display region A includes the first conductive layer 301, the metal thin film layer 302, and the second conductive layer 303 which are stacked one above another. The anode 30 in the non-display region B includes only the metal thin film layer 302. Such configuration effectively prevents the peeling problem from occurring at interfaces between layers of the anode 30 in the non-display region B, especially prevents the peeling problem from occurring at interfaces between layers of the anode 30 in the dam region C.

Figure 3:
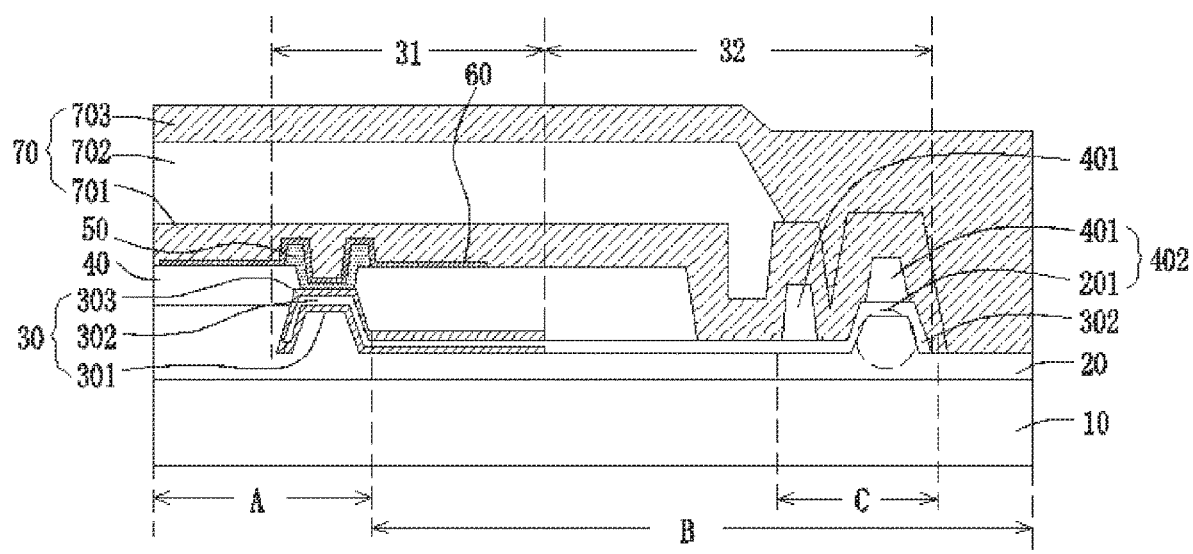
FIG. 3 is a schematic structural view illustrating the OLED display panel according to still another embodiment of the present invention.

FIG. 3 is a schematic structural view illustrating the OLED display panel according to still another embodiment of the present application. The display panel of FIG. 3 is different from the display panel of FIG. 1 in that, the anode 30 includes the first portion 31 and the second portion 32, and a boundary between the first portion 31 and the second portion 32 is positioned between the display region A and the dam region C. The first portion 31 of the anode 30 comprises the first conductive layer 301, the metal thin film layer 302, and the second conductive layer 303 stacked one above another. The second portion 32 of the anode 30 only has the metal thin film layer 302. In detail, a length of the first portion 31 of the anode 30 in the non-display region B is less than a distance between the display region A and the dam region C.

It should be noted that, the boundary between the first portion 31 and the second portion 32 only serves to define/distinguish the first portion 31 and the second portion 32, rather than separating the first portion 31 and the second portion 32 as independent two parts. The first portion 31 and the second portion 32 of the anode 30 are in an integral form.

In the drawing, the first conductive layer 301 of the anode 30 and the second conductive layer 303 of the anode 30 have a same length in the non-display region B.

According to one embodiment of the present invention, the first conductive layer 301 of the anode 30 and the second conductive layer 303 of the anode 30 have different lengths in the non-display region B.

Such configuration effectively prevents the peeling problem from occurring at layer interfaces of the anode 30 in the dam region.

Compared with conventional OLED display panels, the OLED display panel provided by the present application is designed such that the anode has different structures in the display region and the peripheral non-display region. That is, a portion of the anode in the display region has a conventional layer structure, i.e. an ITO/Ag/ITO composite layer, but a portion of the anode outside the display region, especially in the dam region, only has an Ag layer without upper and lower ITO layers. That is, the first conductive layer and the second conductive layer are simultaneously inwardly retracted by a certain distance compared to the conventional structure. The configuration of the present invention effective avoids a peeling problem of conventional OLED display panels between the ITO and Ag layers of an anode in a dam region.

Although the present application has been disclosed in the above embodiments, the embodiments are not intended to be limiting, and those skilled in the art can make various modifications without departing from the spirit and scope of the present application. The protection scope of the present application is determined by the appended claims.

What is claimed is:

1. An organic light-emitting diode (OLED) display panel, comprising:
    a base substrate, the base substrate comprising a display region and a non-display region surrounding the display region, wherein a dam region is disposed in the non-display region, and at least one blocking wall is disposed in the dam region;
    an anode disposed on the base substrate and extending into the dam region from the display region, the at least one blocking wall disposed on a surface of the anode; and
    a first inorganic layer extending from the display region into the dam region and covering the at least one blocking wall;
    wherein the anode is constituted by a first conductive layer, a metal thin film layer, and a second conductive layer stacked one above another, the anode comprises a first portion and a second portion, the first portion is an overlapping portion of the first conductive layer, the metal thin film layer, and the second conductive layer which overlap one another, the first portion is connected to the second portion, the metal thin film layer is a continuous layer and extends into the dam region from the display region, the second portion is a portion of the metal thin film layer extending beyond the first conductive layer and the second conductive layer in a direction away from the display region, the second portion of the anode is disposed at least in the dam region, and the first conductive layer and the second conductive layer extend continuously from the display region into the non-display region until reaching an edge of the dam region close to the display region.

2. The OLED display panel according to claim 1, wherein the first portion of the anode is disposed at least in the display region.

3. The OLED display panel according to claim 2, wherein a length of the first portion of the anode in the non-display region is equal to a distance between the display region and the dam region.

4. The OLED display panel according to claim 3, wherein the first conductive layer of the anode and the second conductive layer of the anode have a same length in the non-display region.

5. The OLED display panel according to claim 2, wherein the second portion of the anode is disposed in the dam region, and the first portion of the anode extends from the display region to the non-display region until contacting the dam region.

6. The OLED display panel according to claim 2, wherein the first portion of the anode is disposed in the display region, and the second portion of the anode is disposed in the non-display region.

7. The OLED display panel according to claim 1, wherein the first conductive layer and the second conductive layer are made of at least one of indium tin oxide, indium zinc oxide, zinc oxide, indium oxide, indium gallium oxide, and zinc aluminum oxide, and the metal thin film layer is made of at least one of aluminum, platinum, palladium, silver, magnesium, gold, nickel, neodymium, iridium, chromium, lithium, calcium, molybdenum, titanium, tungsten, and copper.

8. The OLED display panel according to claim 1, further comprising:
    a light-emitting layer disposed on the anode and arranged in an array pattern corresponding to a pixel region; and
    a cathode disposed on the light-emitting layer.

9. The OLED display panel according to claim 8, wherein the cathode extends from the display region toward the edge of the dam region close to the display region.

10. An organic light-emitting diode (OLED) display panel, comprising:
    a base substrate, the base substrate comprising a display region and a non-display region surrounding the display region, wherein a dam region is disposed in the non-display region, and at least one blocking wall is disposed in the dam region;
    an anode disposed on the base substrate and extending into the dam region from the display region, the at least one blocking wall disposed on a surface of the anode; and
    a first inorganic layer extending from the display region into the dam region and covering the at least one blocking wall;
    wherein the anode is constituted by a first conductive layer, a metal thin film layer, and a second conductive layer stacked one above another, the anode comprises a first portion and a second portion, the first portion is electrically connected to the second portion, the first portion is an overlapping portion of the first conductive layer, the metal thin film layer, and the second conductive layer which overlap one another, the first portion is connected to the second portion, the metal thin film layer is a continuous layer and extends into the dam region from the display region, the second portion is a portion of the metal thin film layer extending beyond the first conductive layer and the second conductive layer in a direction away from the display region, the second portion of the anode is disposed at least in the dam region, and the first conductive layer and the second conductive layer extend continuously from the display region into the non-display region until reaching an edge of the dam region close to the display region.

11. The OLED display panel according to claim 10, wherein the first portion of the anode is disposed at least in the display region.

12. The OLED display panel according to claim 11, wherein a length of the B first portion of the anode in the non-display region is equal to a distance between the display region and the dam region.

13. The OLED display panel according to claim 12, wherein the first conductive layer of the anode and the second conductive layer of the anode have a same length in the non-display region.

14. The OLED display panel according to claim 11, wherein the second portion of the anode is disposed in the dam region, and the first portion of the anode is extended from the display region to the non-display region until contacting the dam region.

15. The OLED display panel according to claim 11, wherein the first portion of the anode is disposed in the display region, and the second portion of the anode is disposed in the non-display region.

16. The OLED display panel according to claim 10, wherein the first conductive layer and the second conductive layer are made of at least one of indium tin oxide, indium zinc oxide, zinc oxide, indium oxide, indium gallium oxide, and zinc aluminum oxide, and the metal thin film layer is made of at least one of aluminum, platinum, palladium, silver, magnesium, gold, nickel, neodymium, iridium, chromium, lithium, calcium, molybdenum, titanium, tungsten, and copper.

17. The OLED display panel according to claim 10, wherein the display panel further comprises:
   a light-emitting layer disposed on the anode and arranged in an array pattern corresponding to a pixel region; and
   a cathode disposed on the light-emitting layer.

18. The OLED display panel according to claim 17, wherein the cathode extends from the display region toward the edge of the dam region close to the display region.

* * * * *